(12) United States Patent
Taeger et al.

(10) Patent No.: US 12,176,467 B2
(45) Date of Patent: Dec. 24, 2024

(54) ELECTROMAGNETIC RADIATION EMITTING DEVICE AND METHOD OF APPLYING A CONVERTER LAYER TO AN ELECTROMAGNETIC RADIATION EMITTING DEVICE

(71) Applicant: OSRAM OLED GmbH, Regensburg (DE)

(72) Inventors: Sebastian Taeger, Bad Abbach (DE); Siegfried Herrmann, Neukirchen (DE); Adrian Stefan Avramescu, Regensburg (DE); Alexander Behres, Pfatter (DE)

(73) Assignee: OSRAM OLED GmbH, Regensburg (DE)

( * ) Notice: Subject to any disclaimer, the term of this patent is extended or adjusted under 35 U.S.C. 154(b) by 622 days.

(21) Appl. No.: 17/265,475

(22) PCT Filed: Aug. 2, 2019

(86) PCT No.: PCT/EP2019/070913
§ 371 (c)(1),
(2) Date: Feb. 2, 2021

(87) PCT Pub. No.: WO2020/025803
PCT Pub. Date: Feb. 6, 2020

(65) Prior Publication Data
US 2021/0280748 A1    Sep. 9, 2021

(30) Foreign Application Priority Data
Aug. 3, 2018   (DE) .......................... 102018118962.1

(51) Int. Cl.
*H01L 33/50*   (2010.01)
*H01L 33/00*   (2010.01)

(52) U.S. Cl.
CPC .......... *H01L 33/501* (2013.01); *H01L 33/005* (2013.01); *H01L 2933/0025* (2013.01); *H01L 2933/0041* (2013.01)

(58) Field of Classification Search
USPC ......................................................... 257/98
See application file for complete search history.

(56) References Cited

U.S. PATENT DOCUMENTS 10,230,024 B2    3/2019   O'Brien et al.
2013/0292724 A1*  11/2013   Wagner ................. H01L 33/505
                                                 257/98

(Continued)

FOREIGN PATENT DOCUMENTS

| DE | 102010054279 A1 | 6/2012 |
| DE | 102015113052 A1 | 2/2017 |
| EP | 2645433 A2 | 10/2013 |

*Primary Examiner* — Fazli Erdem
(74) *Attorney, Agent, or Firm* — Slater Matsil, LLP

(57) ABSTRACT

An electromagnetic radiation emitting device and a method for applying a converter layer to an electromagnetic radiation emitting device are disclosed. In an embodiment, a method includes applying converter elements to a surface of a carrier, applying the converter elements to an electromagnetic radiation emitting device by applying the carrier to the electromagnetic radiation emitting device such that the surface of the carrier with the applied converter elements faces the electromagnetic radiation emitting device and forming a converter layer on the electromagnetic radiation emitting device by depositing a plurality of thin layers on the converter elements using an atomic layer deposition process.

18 Claims, 13 Drawing Sheets

(56) References Cited

U.S. PATENT DOCUMENTS

| | | |
|---|---|---|
| 2013/0292725 A1 | 11/2013 | Yoo |
| 2013/0320385 A1 | 12/2013 | Ahlstedt et al. |
| 2015/0159836 A1* | 6/2015 | Tamaki ................ H01L 33/505 |
| | | 362/343 |
| 2016/0149097 A1* | 5/2016 | Saka ................... C23C 16/4417 |
| | | 428/143 |
| 2017/0331003 A1* | 11/2017 | Cheng ..................... H01L 33/22 |
| 2017/0331064 A1* | 11/2017 | Trummer-Sailer ......................... |
| | | H10K 50/844 |
| 2018/0122993 A1* | 5/2018 | Camras ................ H01L 33/005 |
| 2018/0175154 A1 | 6/2018 | Song |
| 2018/0219144 A1* | 8/2018 | Perkins .................. H01L 33/60 |
| 2019/0058093 A1* | 2/2019 | O'Brien ............... H01L 33/504 |

* cited by examiner

ELECTROMAGNETIC RADIATION EMITTING DEVICE AND METHOD OF APPLYING A CONVERTER LAYER TO AN ELECTROMAGNETIC RADIATION EMITTING DEVICE

This patent application is a national phase filing under section 371 of PCT/EP2019/070913, filed Aug. 2, 2019, which claims the priority of German patent application 102018118962.1, filed Aug. 3, 2018, each of which is incorporated herein by reference in its entirety.

TECHNICAL FIELD

The present invention relates to an electromagnetic radiation emitting device and a method of applying a converter layer to an electromagnetic radiation emitting device.

BACKGROUND

Phosphors for high luminance, which are also exposed to environmental influences, must meet special requirements.

SUMMARY

Embodiments provide a method for applying a converter layer to an electromagnetic radiation emitting device. Further embodiments provide an electromagnetic radiation emitting device.

A method of depositing a converter layer, also referred to as a conversion layer, on an electromagnetic radiation emitting device according to one embodiment provides that converter elements, also referred to as conversion elements, are deposited on an electromagnetic radiation emitting device and that a converter layer is formed on the electromagnetic radiation emitting device by depositing a plurality of thin layers on the converter elements by means of an atomic layer deposition (ALD) process.

The thin layers surround or coat the converter elements deposited on the electromagnetic radiation emitting device. The converter elements are fixed to the electromagnetic radiation emitting device by the deposition of the thin layers. Together with the converter elements, the thin films form the converter layer.

A semiconductor chip emitting electromagnetic radiation can be integrated into the electromagnetic radiation emitting device.

The electromagnetic radiation emitted by the device or semiconductor chip can be, for example, light in the visible range, ultraviolet (UV) light, and/or infrared light. In this context, the electromagnetic radiation emitting semiconductor chip can be, for example, a light emitting diode (LED), an organic light emitting diode (OLED), a light emitting transistor, or an organic light emitting transistor. In various embodiments, the electromagnetic radiation emitting device or semiconductor chip can be part of an integrated circuit. Further, a plurality of electromagnetic radiation emitting devices or semiconductor chips can be provided.

A wide variety of types can be used as semiconductor chips, such as semiconductor chips of a SFC (sapphire flip chip), a sapphire chip and a SMT (surface mounting technology) type.

In addition to the electromagnetic radiation emitting semiconductor chip, the device can also include other semiconductor chips and/or other components.

The electromagnetic radiation emitting device can comprise a housing in which, for example, the semiconductor chip is arranged. The semiconductor chip can, for example, be encapsulated with purely inorganic material in a thin layer. Any known design of a housing can be used. For example, a so-called chip size package or chip scale package can be used, in which the size of the housing is of the order of the size of the semiconductor chip.

The converter layer and the converter elements contained therein are designed to transform or convert electromagnetic radiation emitted from the device or semiconductor chip into electromagnetic radiation of a different wavelength. In other words, the converter layer and the converter elements are adapted to convert a primary radiation generated by the device or the semiconductor chip. Primary radiation entering the converter layer is at least partially converted into secondary radiation by the converter layer. In this case, the secondary radiation comprises wavelengths which differ from the wavelengths of the primary radiation, i.e. which are longer or shorter than the wavelengths of the primary radiation.

The converter layer can, but does not have to, be deposited directly on the active layer of the device or semiconductor chip that generates the electromagnetic radiation. It may well be that one or more other layers are located between the active layer and the converter layer.

Further, the device can contain exactly one or more than one converter layer.

It should be noted that when the converter layer is applied, the electromagnetic radiation emitting device can already have been separated from a wafer composite by singulation or can be in a wafer composite. If desired, the wafer can be separated in the latter case in a process step after the application of the converter layer.

The electromagnetic radiation emitting device can be used, for example, in any type of display, i.e., optical display devices, in particular in industrial or medical applications for displaying data or simulations, or in video walls, head-up displays (HUD) and head-mounted displays (HMD) in automotive, airborne, or defense applications, and in industrial projection applications, for example, fringe/pattern projections in metrology, 3D sensors, rapid prototyping processes, lithography processes, and IR projections.

The method described herein makes it possible to design the device compactly. The conversion properties of the converter layer can be selectively adjusted and the converter layer can also be provided with additional properties. In addition, the converter layer produced by the atomic layer deposition process offers thermal advantages over conventionally produced converter layers. Furthermore, yellowing during high current operation can be avoided or at least reduced.

The method described herein also opens up the possibility of producing an RGB LED from purely inorganic material. Particularly fine pixelation is possible because the distances between the converter elements can be selected to be very small. The converter layer with the converter elements contained therein can improve the decoupling properties, for example by reducing the probability of total reflection when the light is emitted.

The method also allows precise positioning of local conversion areas on active layers. For example, RGB LEDs with fine substructures, which are for example used in display components, can be locally covered with converter layers.

To apply the converter elements to the electromagnetic radiation emitting device, the converter elements can first be applied in a thin layer to the surface of a carrier, for example by means of spraying or surface tensioning processes or electrostatic processes. Subsequently, the carrier is applied to the electromagnetic radiation emitting device in such a way that the surface of the carrier to which the converter elements are attached faces the electromagnetic radiation emitting device, i.e., faces the device. In particular, the converter elements are applied to the active layer or the decoupling layer of an LED semiconductor chip.

The carrier can be a rigid carrier, such as a semiconductor wafer, or a flexible or bendable carrier, such as a film such as a plastic film, or a glass carrier. The carrier can have adhesive properties so that the converter elements adhere to the carrier at least temporarily.

The carrier can have openings through which reactants are fed to the converter elements during the performance of the atomic layer deposition process. After the carrier has been applied to the electromagnetic radiation emitting device, a space is formed between the carrier and that surface of the electromagnetic radiation emitting device, on which the converter layer is to be formed. The reactants, in particular gaseous reactants, can be introduced into this space through the openings in the carrier.

The openings can be arranged in a regular pattern, in particular in a regular grid, in the carrier. The spacing of two directly adjacent openings depends on the distance of the carrier from the surface to be coated. Provided that the distance of the carrier from the surface to be coated is in the range of a few μm, then the spacing of the openings in the carrier can be in the mm range. However, if the distance of the carrier from the surface to be coated is less than 1 μm, then the spacing of the openings in the carrier should be smaller, e.g. at most 100 μm, to ensure that the reactants reach every location on the surface to be coated.

During the performance of the atomic layer deposition process, different reactants can be alternately and separately fed to the converter elements, in particular through the openings in the carrier.

The chemical reaction of the reactants forms the thin films in which the converter elements are embedded and by which the converter elements are fixed to the desired surface of the electromagnetic radiation emitting device.

The reactants are also referred to as precursors. The reactants are admitted to the reaction chamber cyclically and one after the other. Between the gas inlets, the reaction chamber is usually purged with an inert gas, e.g. argon. In this way, the partial reactions are separated from each other and confined to the surface to be coated.

In a two-component atomic layer deposition process, the following steps can be performed:

The first reactant, e.g. a metal precursor such as trimethylaluminum (TMA), is admitted into the reaction chamber and adheres to the surface.

The reaction chamber is purged with an inert gas to flush out the unbound first reactant.

The second reactant, e.g. an oxygen supplier such as water in the form of steam, is admitted into the reaction chamber and reacts with the trimethylaluminum adhering to the surface, forming aluminum oxide that coats the converter elements.

The reaction chamber is purged with an inert gas.

These four steps together form one cycle. One thin layer is deposited per cycle. The cycle described must be repeated several times during the coating process to achieve the desired thickness of the converter layer.

The atomic layer deposition process allows the converter elements to be uniformly and conformally coated and fixed to the substrate.

Furthermore, the atomic layer deposition process can be used to prepare numerous inorganic transparent materials with refractive indices between 1.45 and 2.4, e.g., $MgF_2$, $SiO_2$, $Al_2O_3$, $HfO_2$, $ZrO_2$, $Ta_2O_5$, $ZnS$, $PrTiO_3$, and $TiO_2$.

After deposition of the converter layer, the carrier can be left on the converter layer. Alternatively, the carrier can be removed from the converter layer. For example, the carrier can be coated with a UV-sensitive adhesive for adhering the converter elements. After forming the converter layer, the adhesive is irradiated with UV light, allowing the carrier to be removed powerlessly.

To ensure the removability of the carrier, it can be necessary to use selective steps in performing the atomic layer deposition process. For example, many water-based atomic layer deposition processes require OH groups on the surface to be coated. Hydrophobic surfaces are very rarely coated.

To apply the carrier with the converter elements adhering to it to the electromagnetic radiation emitting device, a negative pressure can be generated in the space between the carrier and the electromagnetic radiation emitting device. The negative pressure causes a force on the carrier in the direction of the electromagnetic radiation emitting device. The negative pressure can be generated, for example, with a pump, in particular a vacuum pump.

To make it possible to create a negative pressure despite the holes in the carrier, a film that has no holes can be placed on the side of the carrier facing away from the electromagnetic radiation emitting device. Alternatively, the holes can be generated in the carrier only after the carrier has already been applied to the surface to be coated by means of the negative pressure.

A flexible design of the carrier, in particular as a foil, advantageously allows the converter layer or the reflector and absorber layers described below to be applied to non-planar surfaces of the electromagnetic radiation emitting device. Due to the flexibility of the carrier, the carrier can conform to the non-planar surface and the converter, reflector and/or absorber layers can thus overform three-dimensional structures.

In addition to the converter layer, the atomic deposition process can also be used to deposit one or more reflector layers and/or one or more absorber layers on the electromagnetic radiation emitting device. For this purpose, reflector and/or absorber elements are first deposited on the electromagnetic radiation emitting device. Then, analogously to the production of the converter layer, several thin layers are deposited on the reflector and/or absorber elements by means of an atomic layer deposition process to form the reflector and/or absorber layers.

The reflector elements and the absorber elements are designed in such a way that they at least partially reflect or absorb the electromagnetic radiation emitted by the device and/or electromagnetic radiation of other wavelengths.

The reflector and/or absorber elements can first be applied to a carrier and then, with the aid of the carrier, to the electromagnetic radiation emitting device. In particular, the reflector and/or absorber elements can be applied to the same carrier as the converter elements, whereby the areas in which the converter, reflector and/or absorber elements are applied are separated from each other. This makes it possible to produce both a converter layer and a reflector and/or an absorber layer in one and the same step of the atomic layer deposition process. Furthermore, thinnest converter, reflector and absorber layers can be seamlessly arranged directly next to each other.

Furthermore, the reflector and/or absorber layers can also be deposited on areas of the electromagnetic radiation emitting device that do not generate electromagnetic radiation, such as a surface of the encapsulation or a carrier of the semiconductor chip.

The ALD technique can be used to deposit further layers, which optionally also contain converter elements, on the electromagnetic radiation emitting device. According to one embodiment, at least one further layer is deposited on the electromagnetic radiation emitting device in addition to the converter layer. If the at least one further layer is deposited using an atomic layer deposition process, the at least one further layer can comprise a plurality of individually deposited thin layers. The converter layer and the at least one further layer can be stacked in a desired order and can have different refractive indices.

Furthermore, in addition to the converter layer, at least two further layers can be applied to the electromagnetic radiation emitting device, in particular by means of an atomic layer deposition process. The converter layer and the at least two further layers can have different refractive indices. The converter layer and the at least two further layers can be stacked on top of each other in such a way that the refractive indices of the converter layer and the at least two further layers decrease or increase along the radiation direction of the electromagnetic radiation emitted by the device.

By combining the converter layer with at least one or at least two further layer(s) with different refractive index, refractive index gradients, continuous refractive index matching and decoupling layers can be created. Furthermore, distributed Bragg reflectors (DBR) can be produced by stacking layers of different refractive indices.

The converter elements can be ceramic particles, nanorods, microrods, quantum dots, and/or epitaxially grown structures. The converter elements can be partially or fully formed from these materials. It is also conceivable to manufacture the converter elements from other materials.

The multiple thin layers of the converter layer are preferably made of a material that is substantially transparent to at least a portion of the electromagnetic radiation emitted from the device. For example, the layers can be manufactured of $MgF_2$, $SiO_2$, $Al_2O_3$, $HfO_2$, $ZrO_2$, $Ta_2O_5$, $PrTiO_3$, ZnS, and/or $TiO_2$. These materials can also be used to manufacture the other layers whose refractive index is different from the refractive index of the converter layer.

The following table shows the approximate refractive indices for the selected coating materials mentioned above:

| Material | Refractive index |
| --- | --- |
| Magnesium fluoride ($MgF_2$) | 1.38 |
| Silicon dioxide ($SiO_2$) | 1.46 |
| Alumnium oxide ($Al_2O_3$) | 1.7 |
| Zirconia ($ZrO_2$) | 2.05 |
| Praseodymium titanium oxide ($PrTiO_3$) | 2.1 |
| Titanium oxide ($TiO_2$) | 2.3 |
| Zinc sulfide (ZnS) | 2.3 |

The electromagnetic radiation emitting device can be partially made of an encapsulation material which can be coated with one or more converter, reflector and/or absorber layers with the aid of the method described herein. For this purpose, converter, reflector and/or absorber elements are applied to the encapsulation material and the converter, reflector and/or absorber layer(s) is/are formed by depositing multiple thin layers on the converter, reflector and/or absorber elements using an atomic layer deposition process. Furthermore, other components of the electromagnetic radiation emitting device, for example a leadframe, can also be coated with the converter, reflector and/or absorber layers.

The encapsulation material, also called mold, can for example at least partially encapsulate a semiconductor chip integrated in the electromagnetic radiation emitting device, but can also be designed to direct or focus the electromagnetic radiation emitted by the device in a specific direction, in particular by means of a reflector layer applied to the encapsulation material. The encapsulation material can in particular be a thermoplastic or thermoset plastic or a thermoplastic resin.

An electromagnetic radiation emitting device according to one embodiment comprises an electromagnetic radiation emitting semiconductor chip and at least one converter layer deposited on the electromagnetic radiation emitting semiconductor chip. The at least one converter layer has a plurality of thin layers in which converter elements are embedded. The plurality of thin layers each have a thickness of at most 100 nm. In particular, the thickness of each of the layers is at most 50 nm or 40 nm or 30 nm or 20 nm or 10 nm. The converter layer can be formed of at least 10 or 20 or 50 or 100 of these layers. The thin layers can be formed, for example, by means of the atomic layer deposition process described above.

In addition to the converter layer, at least one further layer can be applied to the electromagnetic radiation emitting device, in which converter elements can optionally be embedded. The converter layer and the at least one further layer can have different refractive indices.

Furthermore, in addition to the converter layer, at least two other layers can be deposited on the electromagnetic radiation emitting device, and the refractive indices of the converter layer and the at least two other layers can decrease or increase along the radiation direction of the electromagnetic radiation emitted from the semiconductor chip.

Furthermore, the electromagnetic radiation emitting semiconductor chip can be at least partially surrounded by an encapsulation material. At least one converter, reflector and/or absorber layer can be deposited on the encapsulation material. The at least one converter, reflector and/or absorber layer can comprise a plurality of thin layers in which converter, reflector and/or absorber elements are embedded, and the plurality of thin layers can each have a thickness of 100 nm or less and can be formed, for example, using the atomic layer deposition process described above.

BRIEF DESCRIPTION OF THE DRAWINGS

In the following, embodiments of the invention are explained in more detail with reference to the accompanying drawings. In these schematically show.

In the following detailed description, reference is made to the accompanying drawings, which form a part of this description and in which specific embodiments in which the invention may be practiced are shown for illustrative purposes. Since components of embodiments may be positioned in a number of different orientations, the directional terminology is for illustrative purposes and is not limiting in any way. It is understood that other embodiments may be used and structural or logical changes may be made without departing from the scope of protection. It is understood that the features of the various embodiments described herein may be combined with each other, unless specifically indicated otherwise. Therefore, the following detailed description is not to be construed in a limiting sense. In the figures, identical or similar elements are provided with identical reference signs where appropriate.

DETAILED DESCRIPTION OF ILLUSTRATIVE EMBODIMENTS

Figure 1:
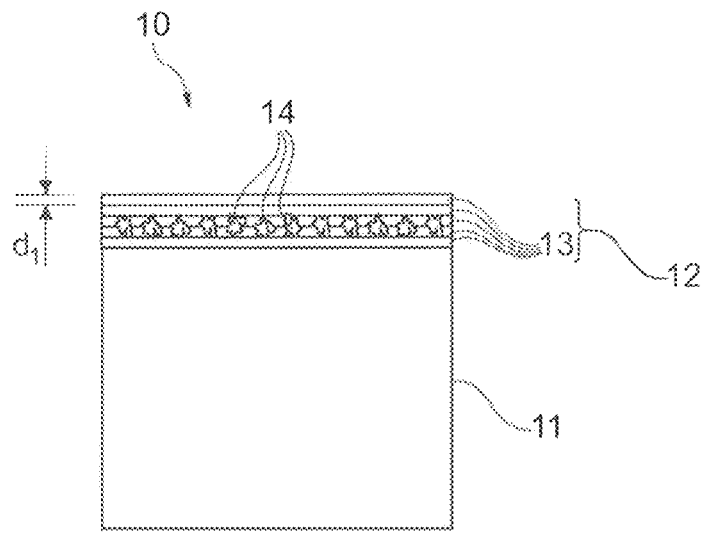
FIG. 1 shows a sectional view of an embodiment of an electromagnetic radiation emitting device.

FIG. 1 shows a schematic sectional view of an embodiment of an electromagnetic radiation emitting device 10.

The device 10 includes an electromagnetic radiation emitting semiconductor chip 11, for example an LED semiconductor chip, and a converter layer 12 deposited on the semiconductor chip 11. The converter layer 12 has a plurality of individually fabricated thin layers 13 in which converter elements 14 are embedded. The layers 13 each have a thickness di of at most 100 nm. In particular, the thickness di of the layers 13 is in each case at most 50 nm or 40 nm or 30 nm or 20 nm or 10 nm. The converter layer 12 can be formed from at least 10 or 20 or 50 or 100 layers 13.

To deposit the converter layer 12 on the semiconductor chip 11, the converter elements 14 are first deposited on one or more surfaces of the semiconductor chip 11. Then, the thin films 13 are successively deposited on the surface or surfaces of the semiconductor chip 11 and the converter elements 14 thereon by an atomic layer deposition process to form the converter layer 12. By depositing the thin layers 13, the converter elements 14 are embedded in the converter layer 12 and fixed to the semiconductor chip 11.

FIGS. 2A to 2D show an embodiment of a method for applying a converter layer to an electromagnetic radiation emitting device.

Figure 2A:
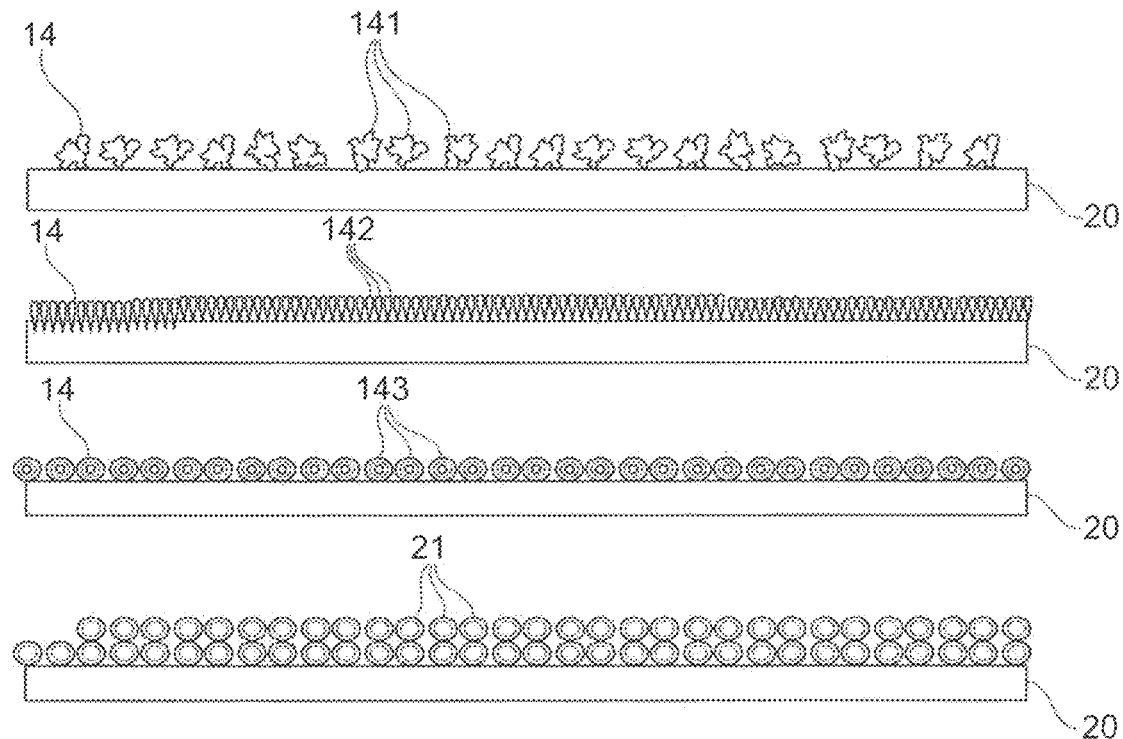
FIG. 2A to 2D show an embodiment of a method for applying a converter layer to an electromagnetic radiation emitting device.

In FIG. 2A, converter elements 14 are applied to a carrier 20. In the present embodiment, the carrier 20 is a flexible foil, also referred to as a transfer foil. Exemplary ceramic particles 141, nanorods 142 and quantum dots 143 are shown as different types of converter elements 14 in FIG. 2A. Furthermore, it is shown in the lowermost embodiment of FIG. 2A that reflector elements 21, for example made of TiO, can also be applied to the carrier 20. This is explained in more detail below in connection with FIGS. 3A to 3C.

Figure 2B:
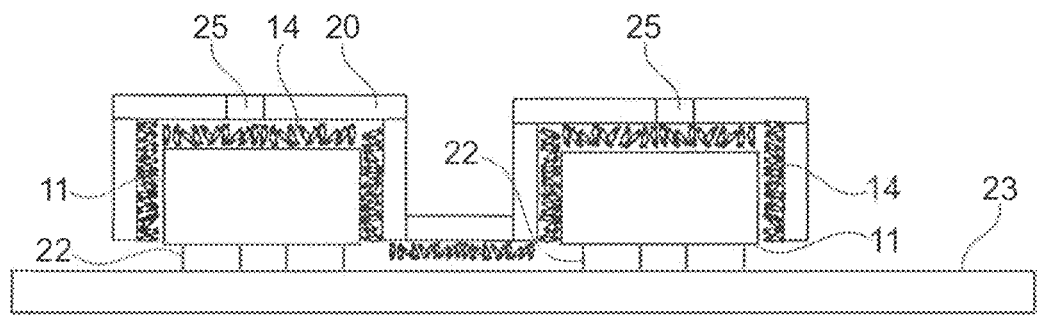

FIG. 2B shows several electromagnetic radiation emitting semiconductor chips 11 with electrical contact elements 22 which have been fixed on a carrier 23. The carrier 20 with the converter elements 14 thereon is applied to the surface of the semiconductor chips 11 such that the converter elements 14 are in contact with the semiconductor chips 11.

To apply the carrier 20, a negative pressure is generated in the space between the carrier 23 or the semiconductor chips 11 and the carrier 20. Since the carrier 20 is flexible, the negative pressure causes the carrier 20 to conform to the surface contour of the carrier 23 with the semiconductor chips 11 located thereon.

The carrier 20 contains openings 25 through which reactants are fed to the converter elements 14 during the subsequently performed atomic layer deposition process. The openings 25 can be located above the semiconductor chips 11, but can also be located elsewhere in the carrier 20.

While performing the atomic layer deposition process, different reactants are alternately and separately admitted through the openings 25 in the carrier 20 into the space between the carrier 23 or semiconductor chips 11 and the carrier 20.

The chemical reaction of the reactants forms the thin films 13 in which the converter elements 14 are embedded and by which the converter elements 14 are attached to the surfaces of the semiconductor chips 11. The thin films can be formed of inorganic transparent materials, e.g., $MgF_2$, $SiO_2$, $Al_2O_3$, $HfO_2$, $ZrO_2$, $Ta_2O_5$, ZnS, $PrTiO_3$, and $TiO_2$.

Figure 2C:
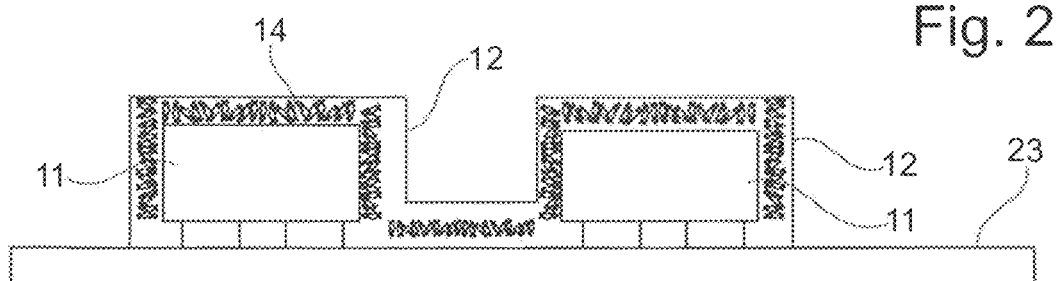

The converter layer 12 formed by the plurality of thin layers 13 and the converter elements 14 embedded therein is shown in FIG. 2C. For reasons of graphic representation, the individual layers 13 are not shown in FIG. 2C.

FIG. 2C shows that the carrier 20 is removed after the converter layer 12 is formed.

Figure 2D:
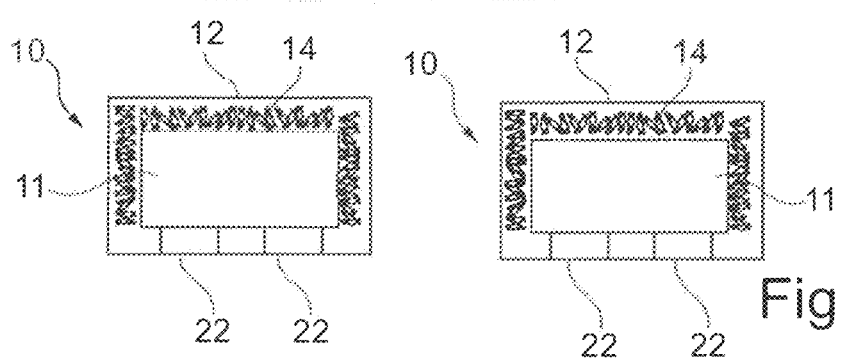

Thereafter, the semiconductor chips 11 are singulated and the carrier 23 is removed to obtain the devices 10 shown in FIG. 2D.

Figure 3A:
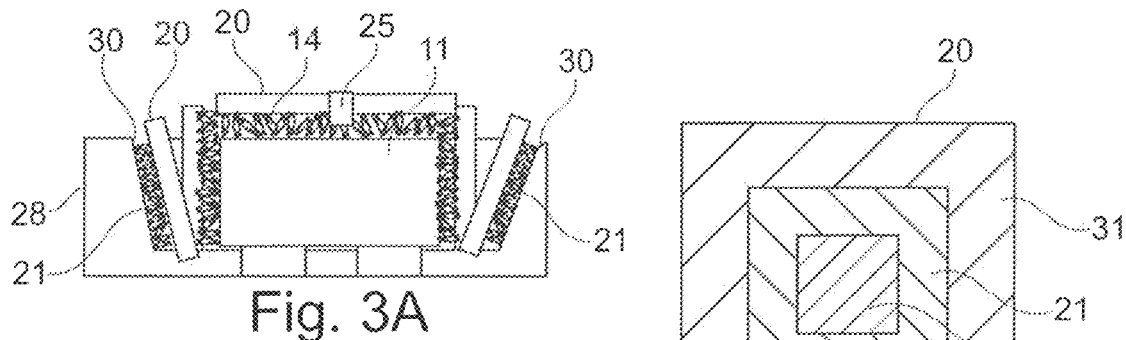
FIGS. 3A to 3C show a further embodiment of a method for applying a converter layer to an electromagnetic radiation emitting device.
Figure 3B:
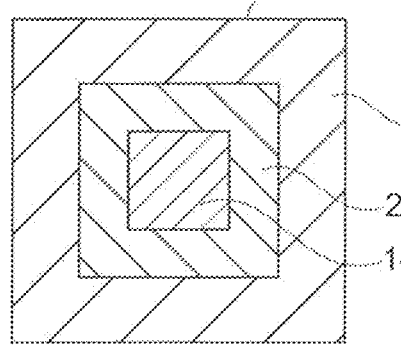
Figure 3C:
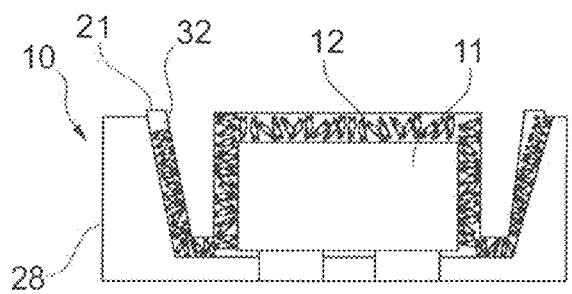

FIGS. 3A to 3C show another embodiment of a method for applying a converter layer to an electromagnetic radiation emitting device, which is a further development of the method shown in FIGS. 2A to 2D.

In this embodiment, the semiconductor chip 11 emitting the electromagnetic radiation is surrounded by an encapsulating material 28. The semiconductor chip 11 is placed in a recess formed by the encapsulating material 28. The encapsulating material 28 forms walls 30 laterally of the semiconductor chip 11, which are inclined with respect to the side surfaces of the semiconductor chip 11 and which are to be coated with reflective material. The carrier 20 is coated such that those areas to be formed on the semiconductor chip 11 are coated with converter elements 14, while those areas to be formed on the walls 30 of the encapsulating material 28 are coated with reflector elements 21. The flexible properties of the carrier 20 allow the carrier 20 to be molded on the semiconductor chip 11 and the encapsulating material 28 as shown in FIG. 3A.

Furthermore, the carrier 20 can also be coated with absorber elements to create absorber layers at certain areas of the device 10. By way of example, FIG. 3B shows a section of a carrier 10 in a plan view, on which converter elements 14, reflector elements 21 and absorber elements 31, respectively, are deposited in certain areas. The structure shown in FIG. 3B can be repeated at regular intervals on the carrier.

As described above, reactants for the atomic layer deposition process are introduced through the openings 25 in the carrier 20, producing the thin layers 13 that coat the converter elements 14 and the reflector elements 21. Thus, both the converter layer 12 on the semiconductor chip 11 and a reflector layer 32 on the walls 30 formed from the encapsulating material 28 can be formed simultaneously. Subsequently, the carrier 20 can be removed.

FIG. 3C shows the completed device 10 with the converter layer 12 as well as the reflector layer 32.

Figure 4:
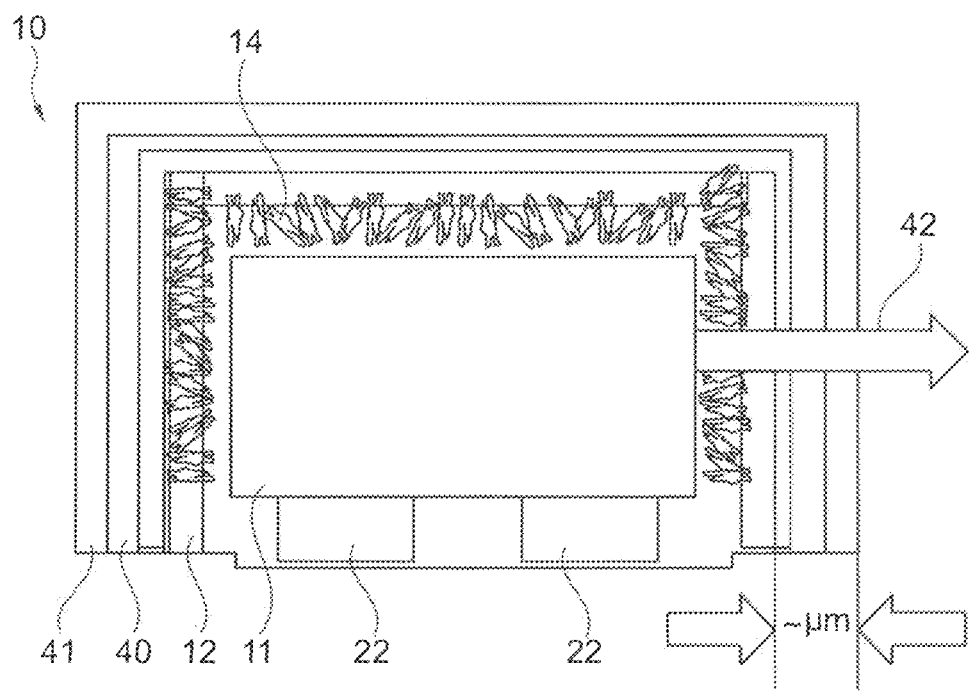
FIG. 4 shows a sectional view of a further embodiment of an electromagnetic radiation emitting device.

FIG. 4 shows a schematic sectional view of another embodiment of an electromagnetic radiation emitting device 10.

In the present embodiment, further transparent layers 40, 41 have been deposited on the converter layer 12 by means of the described atomic layer deposition process or another process. The layers 40, 41 can optionally also contain converter elements. The total thickness of the three layers 12, 40, 41 can be in the µm range. The layers 12, 40, 41 can be stacked on top of each other in the order shown in FIG. 4 or in any other order.

Each of the layers 12, 40, 41 can have a different refractive index. Along a radiation direction 42 of the radiation emitted from the semiconductor chip 11, the refractive index of the layers 12, 40, 41 penetrated by the radiation can, for example, decrease or increase.

Figure 5:
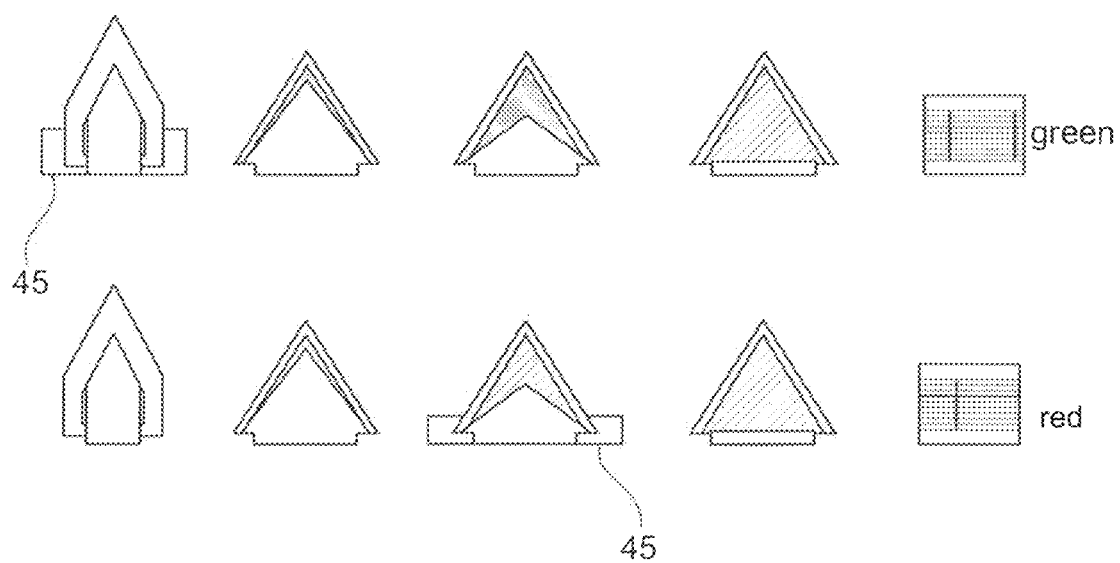
FIG. 5 shows sectional views of epitaxially grown 3D converter elements.

FIG. 5 shows epitaxially grown 3D converter elements with different converter structures. The 3D converter elements can have been locally patterned on an LED epitaxial wafer by selective epitaxy. The top row of FIG. 5 shows converter elements for green light and the bottom row shows converter elements for red light. The areas shown in dark are the light emitting areas. For example, the converter elements for green light can be of GaN and InGaN, while the converter elements for red light can be of GaP and GaAsP. 3D converter elements with other colors, such as yellow, can also be produced.

The 3D converter elements can be transferred to a semiconductor chip 10 by means of a carrier 20, as shown in FIG. 2A. Optionally, the 3D converter elements can be transferred to the semiconductor chip 10 using a growth passivation 45, i.e., a part of the passivation structure of the growth substrate.

Figure 6A:
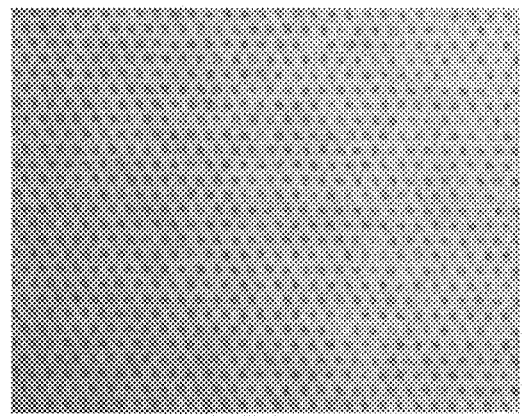
FIG. 6A to 6C show illustrations of carriers with converter elements.
Figure 6B:
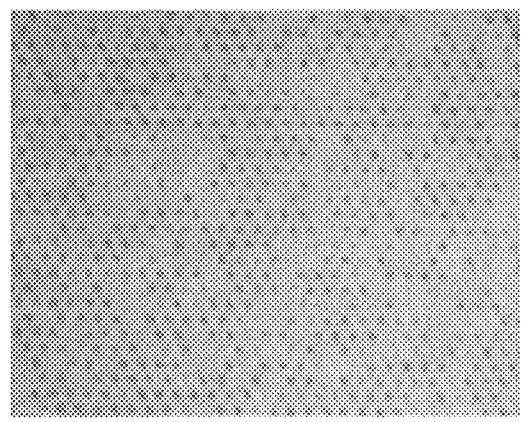

For example, the 3D converter elements can be deposited on the carrier 20 in an array with regular spacing, as exemplarily shown in FIG. 6A. The spacing between the 3D converter elements can also vary in a random manner, for example in a range of +20%, or individual 3D converter elements can be missing from the array, as exemplarily shown in FIG. 6B.

Figure 6C:
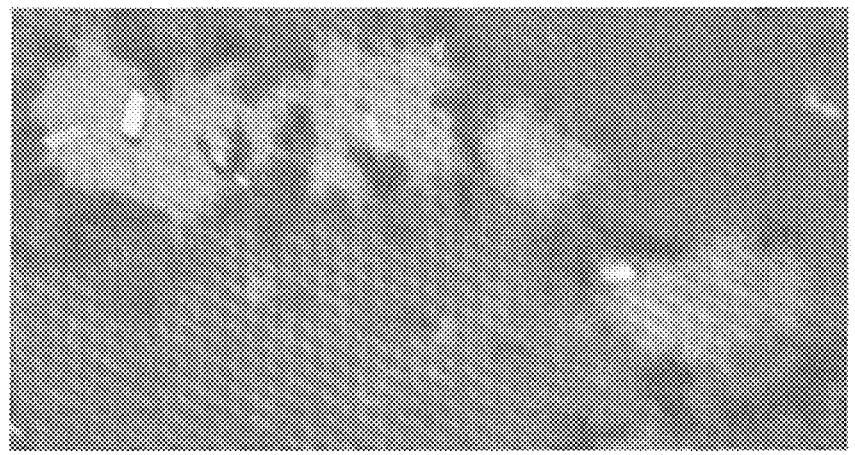

An array with randomly missing 3D converter elements can be obtained by multiple peeling on a foil. FIG. 6C shows an example of such an array.

Figure 7A:
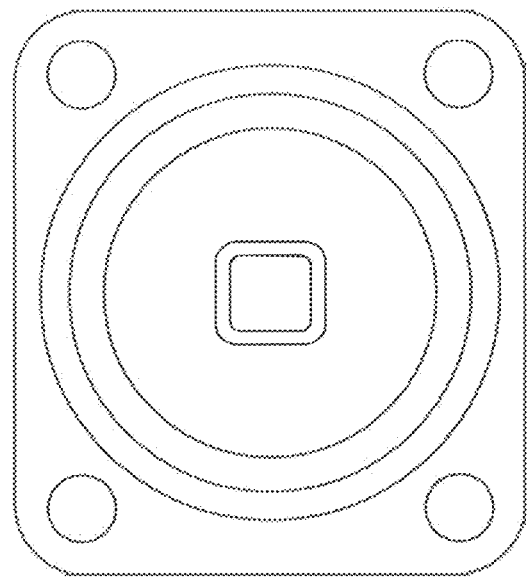
FIGS. 7A and 7B are illustrations of a foil without and with converter elements, respectively.
Figure 7B:
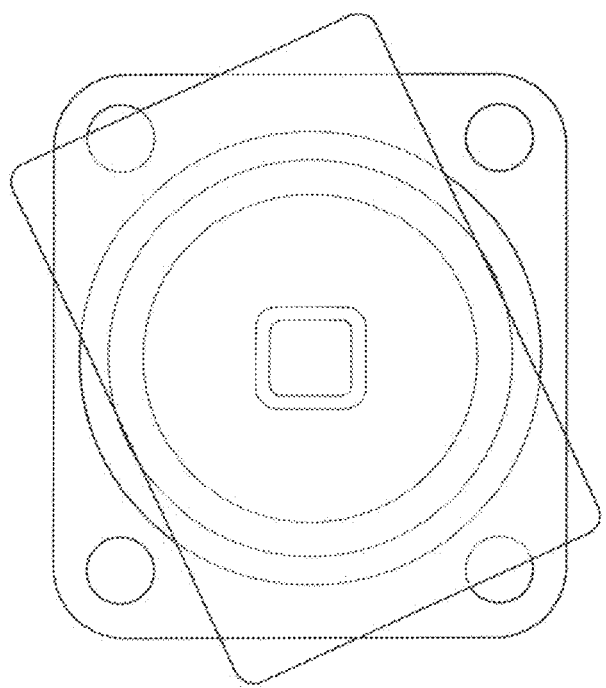

FIG. 7A shows a clear foil without 3D converter elements. FIG. 7B shows a foil with randomly deposited micro rods as 3D converter elements.

Figure 8:
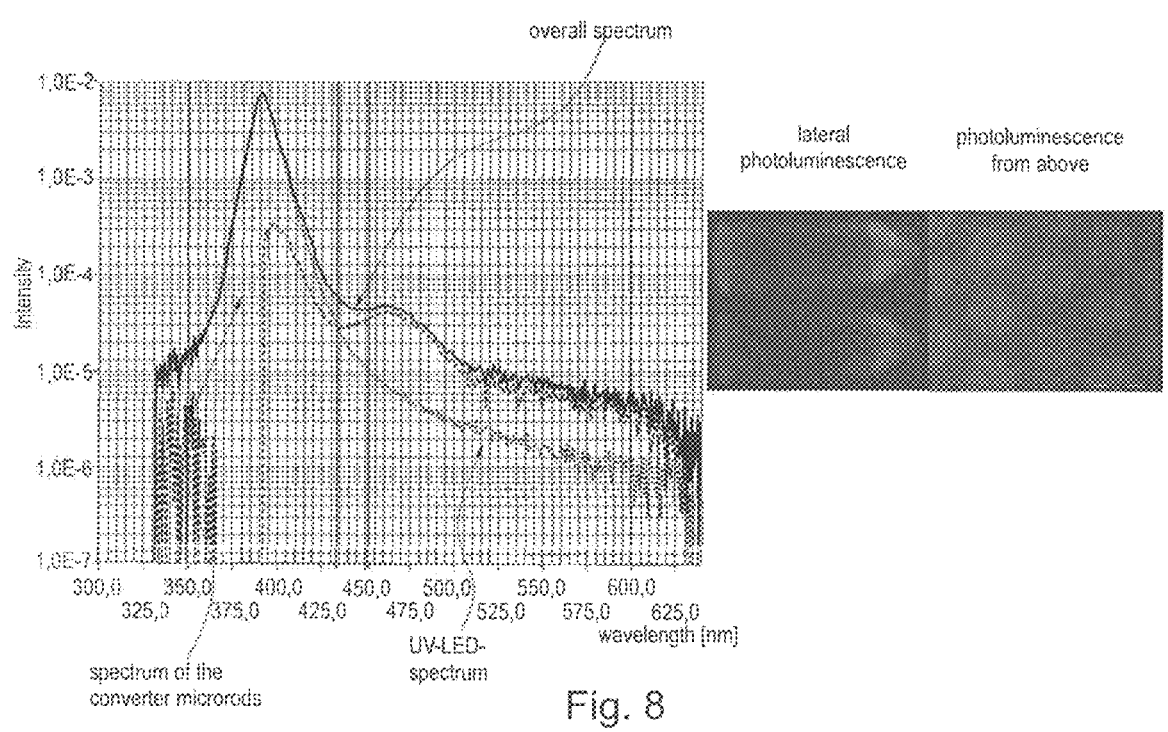
FIGS. 8 and 9 are illustrations of spectra of different converter microrods.

FIG. 8 shows the spectrum of converter microrods emitting blue light at a wavelength of approx. 460 nm. Also shown is the spectrum of a UV LED and the overall spectrum that results when the light emitted from the UV LED passes through a converter layer containing the microrods. Furthermore, the lateral photoluminescence and the photoluminescence from above of the converter microrods are shown.

Figure 9:
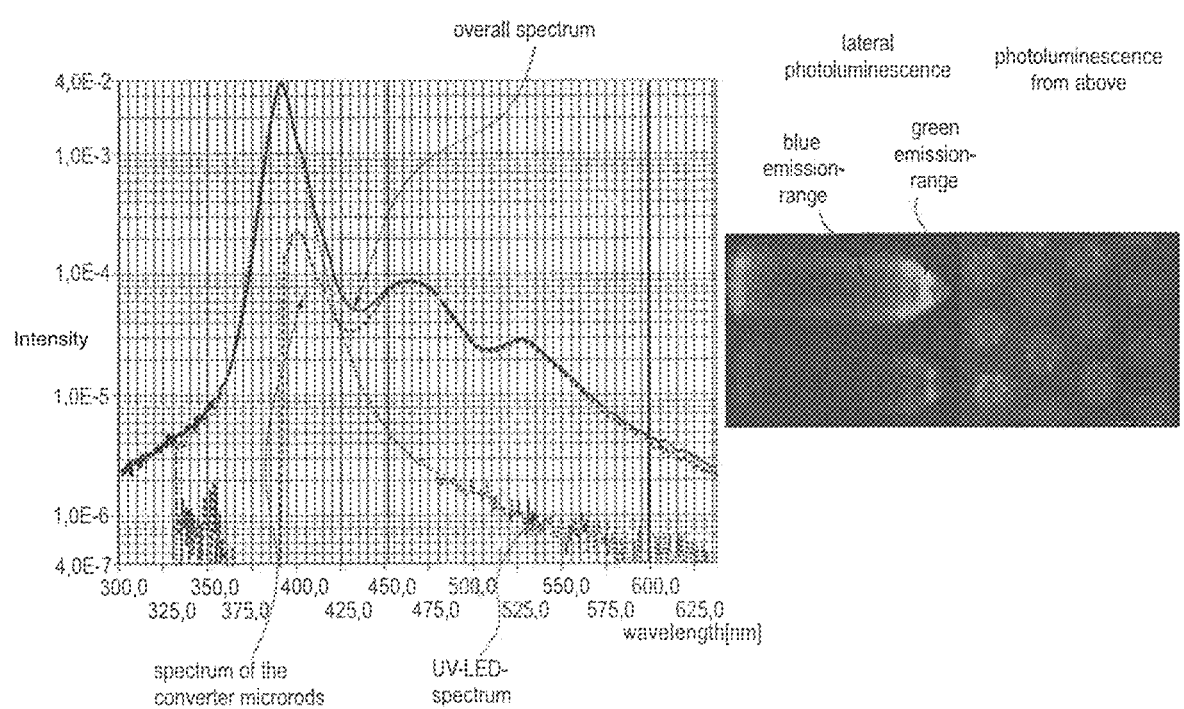

FIG. 9 shows the spectrum of converter microrods emitting blue light at a wavelength of about 460 nm and green light at a wavelength of about 530 nm. The total spectrum of light from a UV LED that has passed through a converter layer containing the microrods is also shown. Furthermore, the lateral photoluminescence and the photoluminescence of the converter microrods are shown from above.

Figure 10A:
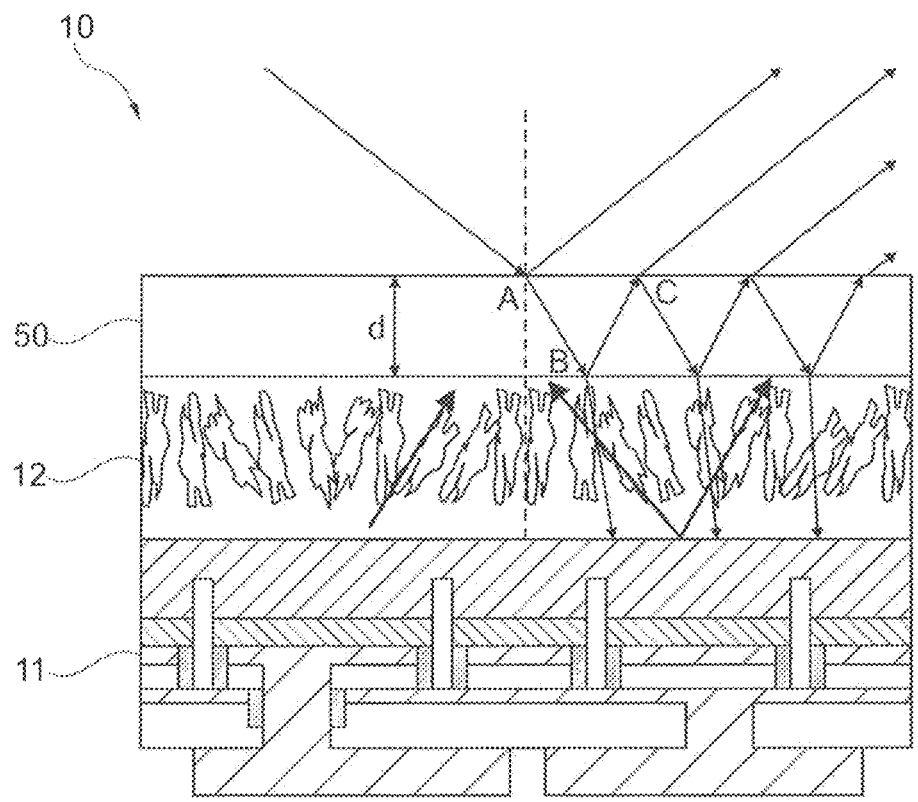
FIGS. 10A and 10B show sectional views of embodiments of an electromagnetic radiation emitting device with anti-reflective coatings.

FIG. 10A shows a schematic sectional view of another embodiment of an electromagnetic radiation emitting device 10. In this embodiment, a layer 50 of magnesium fluoride ($MgF_2$) having a refractive index of 1.38 and a thickness d is deposited on the converter layer 12. For example, the layer 50 can be deposited using the atomic layer deposition process described above. The layer 50 can be used to lower the reflectance of the surface of the device 10.

Figure 10B:
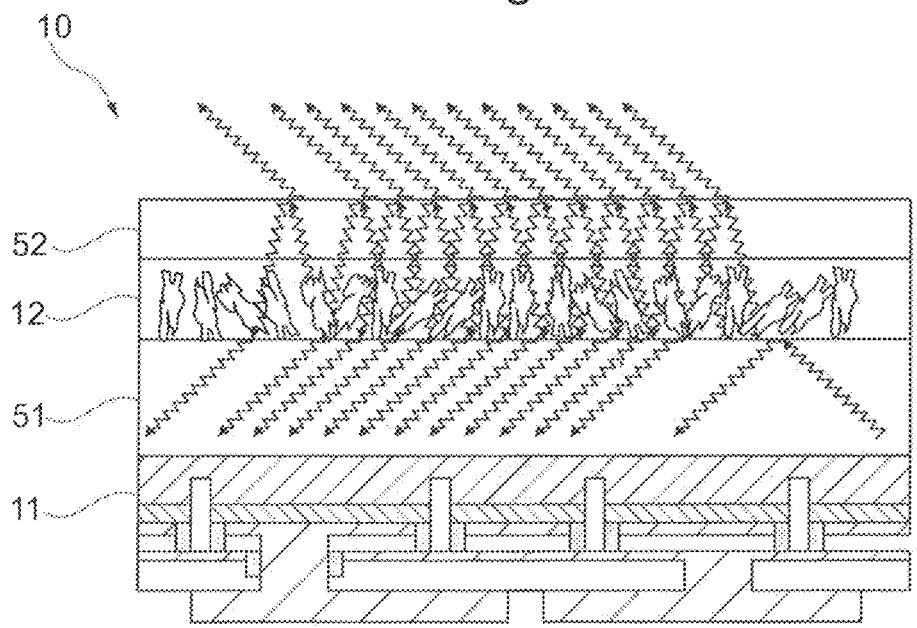

Even a single coating enables an anti-reflective coating for optical elements made of glass. For example, a thin layer of magnesium fluoride on glass can reduce the reflectance from about 4.25% to about 1.25% according to the Fresnel equation for reflectivity. By combining different materials, such as $MgF_2$, $SiO_2$, $Al_2O_3$, $HfO_2$, $ZrO_2$, $Ta_2O_5$, ZnS, $PrTiO_3$, and $TiO_2$, in sometimes complex layer systems, surfaces with a defined refractive index in a specific spectral range can be produced. In this way, a reflection reduction can be significantly improved by a single layer, which strongly depends on the wavelength and the angle of incidence of the light. Often, a triple layer of materials with different refractive indices and thicknesses that function over the entire visible range is sufficient. FIG. 10B shows an embodiment of a device 10 produced in this way with the converter layer 12 and two further layers 51, 52 with different refractive indices, where layer 51 is arranged between the semiconductor chip 11 and the converter layer 12 and layer 52 is arranged above the converter layer 12.

FIGS. 11A to 11G show by way of example that semiconductor chips 11 of a wide variety of types can be used in the device 10.

Figure 11A:
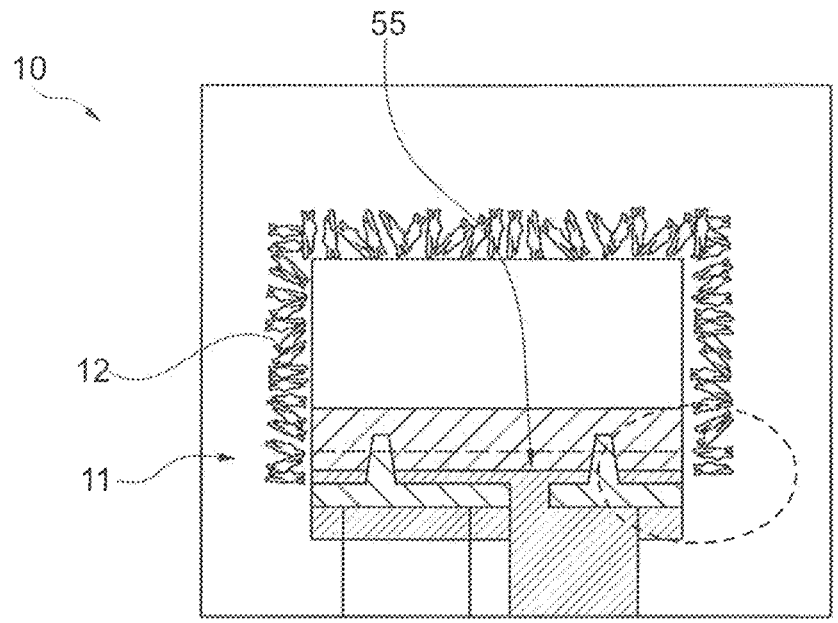
FIGS. 11A to 11G show sectional views of embodiments of an electromagnetic radiation emitting device with different semiconductor chip types.

In FIG. 11A, the semiconductor chip 11 is of the SFC (sapphire flip chip) type and includes a metal mirror 55. The converter layer 12 is deposited on the top and side surfaces of the semiconductor chip 11 and extends to the metal mirror 55.

Figure 11B:
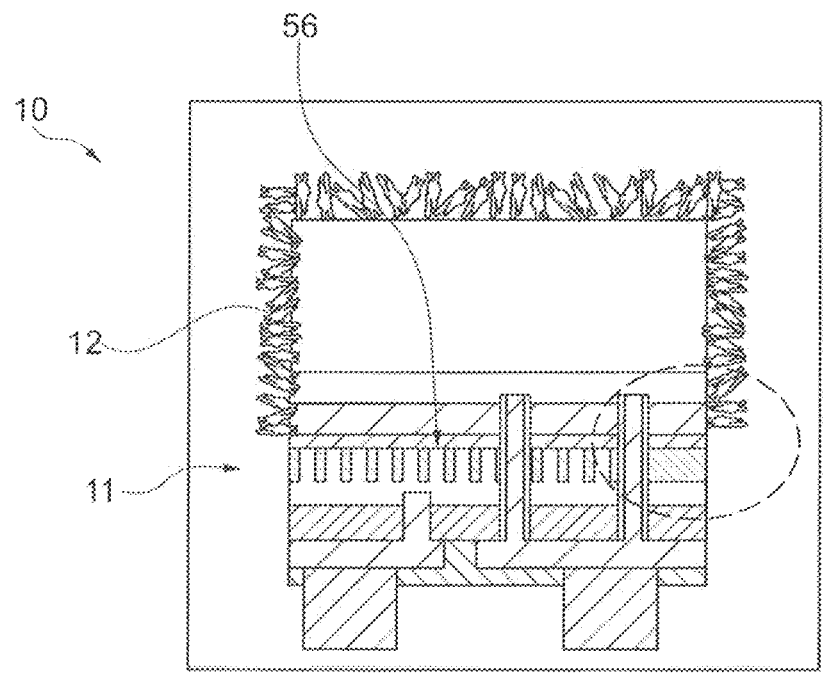

The device 10 shown in FIG. 11B includes an SFC semiconductor chip 11 with a distributed Bragg reflector (DBR) 56. The converter layer 12 on the side surfaces extends to the Bragg reflector 56.

Figure 11C:
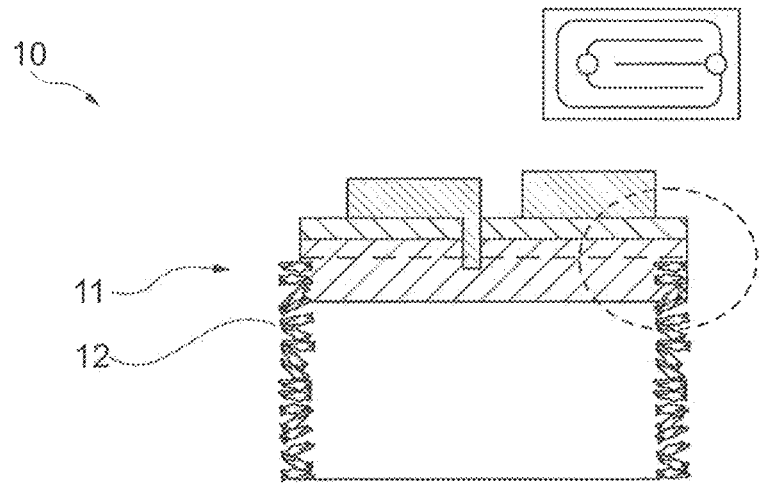

FIG. 11C shows a TE (top emitting) sapphire chip 11 whose side surfaces are covered with the converter layer 12.

Figure 11D:
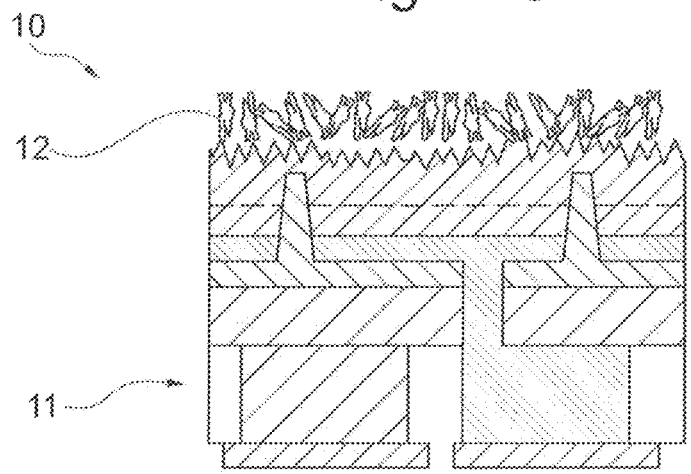
Figure 11E:
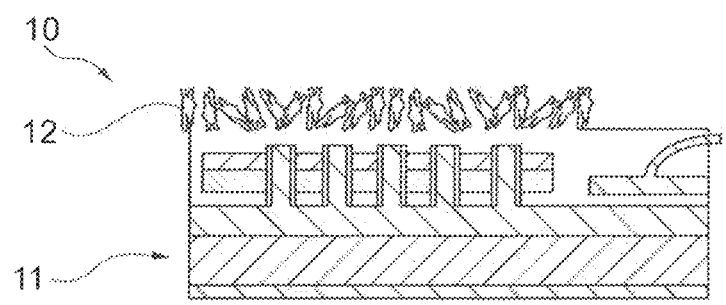

FIG. 11D shows a thin-film semiconductor chip 11 of the MSC (mold supported chip) type. FIG. 11E shows another thin-film semiconductor chip. The converter layer 12 is deposited on the top surface of each semiconductor chip 11.

Figure 11F:
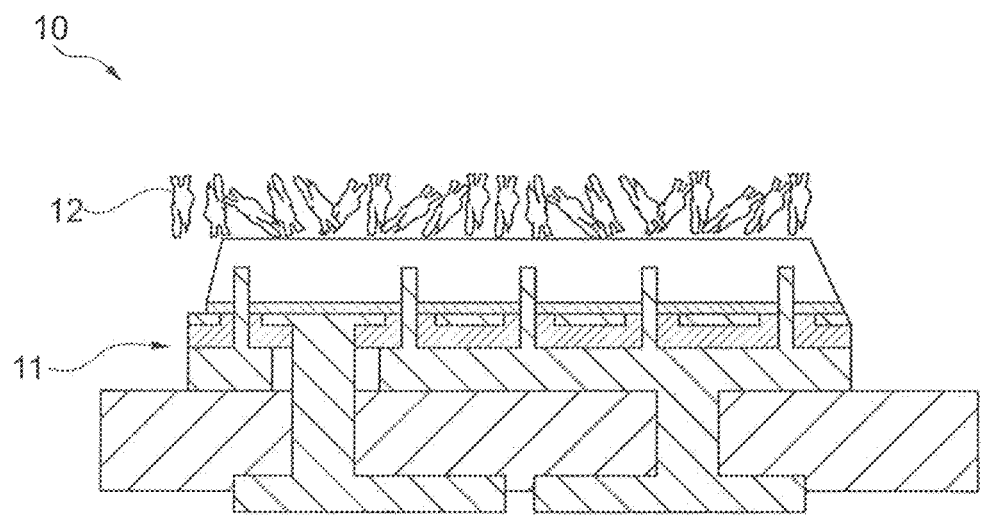
Figure 11G:
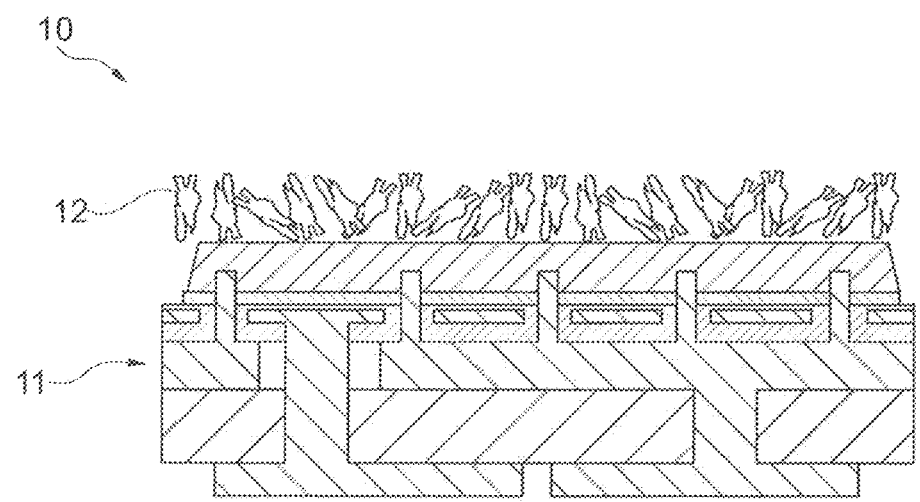

In FIG. 11F, a single thin film LED 10 with a converter layer 12 is shown. FIG. 11G shows a matrix pixel LED 10 with a converter layer 12.

Figure 12:
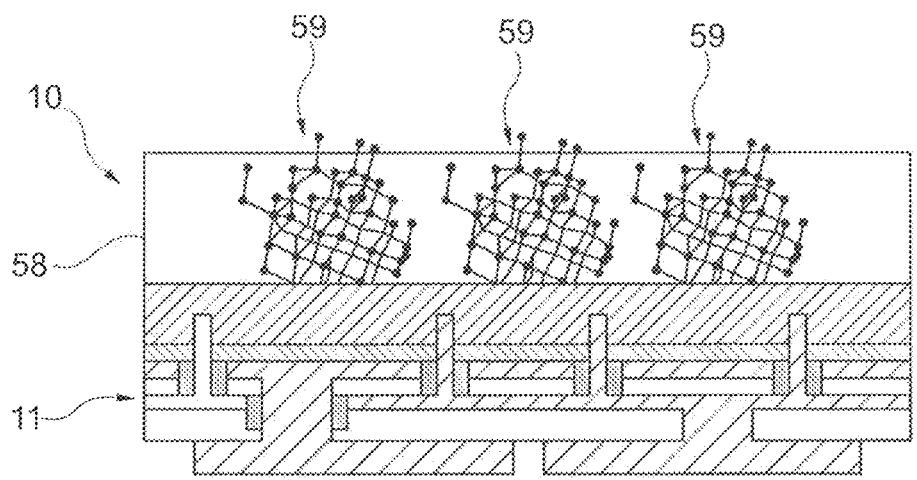
FIG. 12 shows a sectional view of a further embodiment of an electromagnetic radiation emitting device with nanostructures embedded in a layer.

Furthermore, it is possible to embed nanostructures, such as fullerenes or carbon nanotubes, in the various layers described above, thereby adjusting the optical properties of the surface, e.g. the color, and/or the conductivity in a desired manner. By way of example, FIG. 12 shows a device 10 with nanostructures 59 embedded in a layer 58.

Figure 13A:
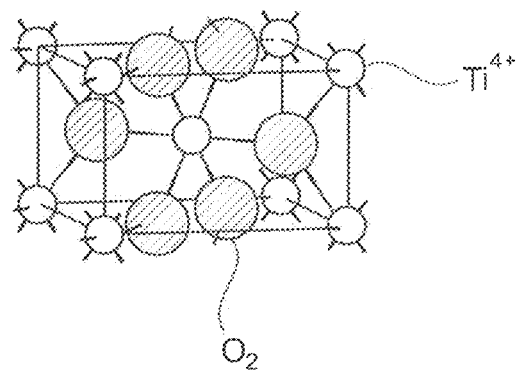
FIGS. 13A and 13B show an illustration of titanium (IV) oxide and a sectional view of a further embodiment of an electromagnetic radiation emitting device having a reflector layer containing titanium (IV) oxide.
Figure 13B:
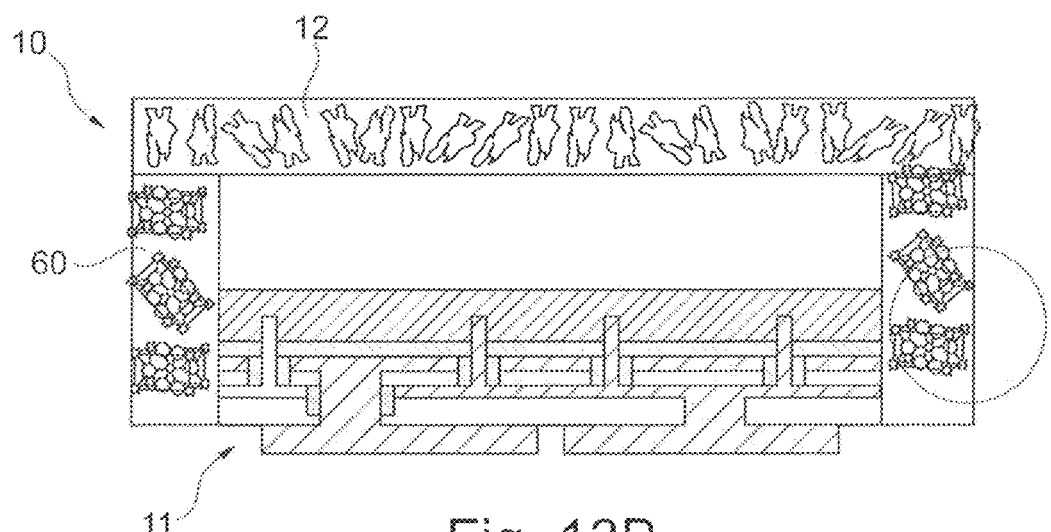

FIG. 13A shows titanium (IV) oxide in the rutile modification as an example of a nanoscale material. As FIG. 13B shows, titanium (IV) oxide can be embedded in a reflector layer 60 covering the side surfaces of an SFC semiconductor chip 11. The reflector layer 60 can be deposited using, for example, the atomic layer deposition process described above.

Figure 14:
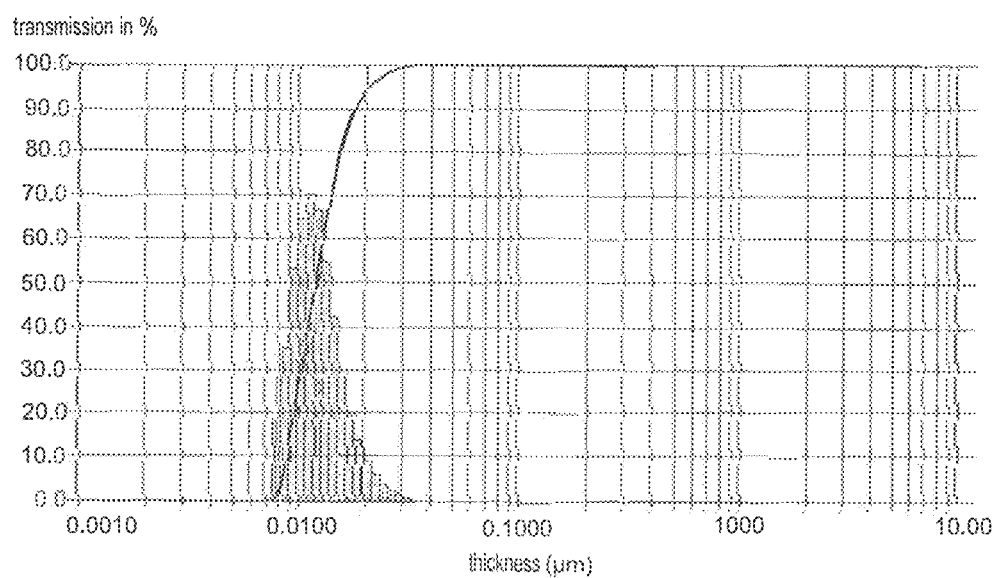
FIG. 14 is an illustration of the permeability of a titanium (IV) oxide layer versus the layer thickness.

Another nanoscale material is the white pigment titanium dioxide, which contains particles in the range of about 300 nm to about 500 nm. Thin layers of nanoscale titanium dioxide on the order of about 10 nm to about 15 nm no longer appear white, but transparent, as can be seen from the diagram of FIG. 14, in which the transmission of light is plotted against the thickness of a layer of titanium dioxide. Such thin layers of titanium dioxide no longer remit visible light. By varying the thickness and in combination with mica layers and other pigments, it is possible to create color effects with many different shades of color. Special effects such as metallic luster or a change in brightness or color depending on the viewing angle are also possible.

When integrated into an electronics housing, the nanoscale materials, in particular titanium dioxide, can be used to achieve color matching of the luminous surface to the electronics housing. Furthermore, the electrical properties can be changed using the same process.

A smooth transition of the refractive index, i.e., a continuously changing refractive index, reduces the reflectance without strong wavelength and angle dependence. However, for the transition to a refractive index of 1, this requires a refractive index close to 1.

The anti-reflective effect due to nanostructures on the surface is also known as the moth-eye effect.

Although the invention has been illustrated and described in detail by means of the preferred embodiment examples, the present invention is not restricted by the disclosed examples and other variations may be derived by the skilled person without exceeding the scope of protection of the invention.

The invention claimed is:

1. A method comprising:
    applying converter elements to a surface of a carrier;
    applying the converter elements to an electromagnetic radiation emitting device by applying the carrier to the electromagnetic radiation emitting device such that the surface of the carrier with the applied converter elements faces the electromagnetic radiation emitting device;
    after applying the carrier to the electromagnetic radiation emitting device, forming a converter layer on the electromagnetic radiation emitting device by depositing a plurality of thin layers on the converter elements using an atomic layer deposition process; and
    applying at least two further layers on the electromagnetic radiation emitting device,
    wherein the converter layer and the at least two further layers have different refractive indices, and
    wherein the refractive indices of the converter layer and the at least two further layers decrease or increase along a radiation direction of the electromagnetic radiation emitting device forming a distributed Bragg reflector on the electromagnetic radiation emitting device.

2. The method of claim 1, wherein the carrier has openings through which reactants are fed to the converter elements during the atomic layer deposition process.

3. The method according to claim 1, wherein, during the atomic layer deposition process, different reactants are alternately and separately fed to the converter elements.

4. The method according to claim 1, further comprising removing the carrier from the converter layer after the converter layer is formed.

5. The method according to claim 1, wherein applying the carrier to the electromagnetic radiation emitting device comprises generating a negative pressure in a space between the carrier and the electromagnetic radiation emitting device.

6. The method according to claim 1, wherein the carrier is flexible and is applied to a non-planar surface of the electromagnetic radiation emitting device.

7. The method according to claim 1, further comprising:
    applying reflector and/or absorber elements to the electromagnetic radiation emitting device; and
    forming a reflector layer and/or an absorber layer on the electromagnetic radiation emitting device by depositing a plurality of thin layers on the reflector and/or absorber elements by an atomic layer deposition process.

8. The method according to claim 1, wherein the converter elements are ceramic particles, nanorods, microrods, quantum dots, and/or epitaxially grown structures.

9. The method according to claim 1, wherein the plurality of thin layers are formed of a material which is substantially transparent to at least a portion of the electromagnetic radiation emitted by the electromagnetic radiation emitting device.

10. The method according to claim 1,
    wherein the electromagnetic radiation emitting device comprises a encapsulating material,
    wherein converter, reflector and/or absorber elements are applied to the encapsulating material, and
    wherein the converter layer, a reflector layer and/or an absorber layer are formed on the encapsulating material by depositing a plurality of thin layers on the converter, reflector and/or absorber elements by an atomic layer deposition process.

11. An electromagnetic radiation emitting device comprising:
    a semiconductor chip configured to emit electromagnetic radiation;
    at least one converter layer located on the semiconductor chip,
    wherein the at least one converter layer has a plurality of thin layers in which converter elements are embedded, and
    wherein each of the plurality of thin layers has a thickness of at most 100 nm; and
    at least two further layers arranged on the converter layer on a side facing away from the semiconductor chip,
    wherein the converter layer and the at least two further layers have different refractive indices, and
    wherein the refractive indices of the converter layer and the at least two further layers decrease or increase along a radiation direction of the electromagnetic radiation emitting device forming a distributed Bragg reflector on the semiconductor chip.

12. The electromagnetic radiation emitting device according to claim 11,
    wherein the semiconductor chip is at least partially surrounded by an encapsulating material,
    wherein the at least one converter layer, a reflector layer and/or an absorber layer is arranged at the encapsulating material, wherein the at least one converter layer, the reflector layer and/or the absorber layer has a plurality of thin layers in which converter, reflector and/or absorber elements are embedded, and wherein each of the plurality of thin layers has a thickness of at most 100 nm.

13. A method comprising:

applying converter elements to a surface of a carrier;

applying the converter elements to an electromagnetic radiation emitting device by applying the carrier to the electromagnetic radiation emitting device such that the surface of the carrier with the applied converter elements faces the electromagnetic radiation emitting device;

forming a converter layer on the electromagnetic radiation emitting device by depositing a plurality of thin layers on the converter elements using an atomic layer deposition process; and removing the carrier from the converter layer after the converter layer is formed, wherein the carrier has openings through which reactants are fed to the converter elements during the atomic layer deposition process.

14. The method according to claim 13, wherein, during the atomic layer deposition process, different reactants are alternately and separately fed to the converter elements.

15. The method according to claim 13, further comprising:

applying reflector or absorber elements to the electromagnetic radiation emitting device; and forming a reflector layer or an absorber layer on the electromagnetic radiation emitting device by depositing a plurality of thin layers on the reflector or absorber elements by an atomic layer deposition process.

16. The method according to claim 13, further comprising:

applying reflector and absorber elements to the electromagnetic radiation emitting device; and forming a reflector layer and an absorber layer on the electromagnetic radiation emitting device by depositing a plurality of thin layers on the reflector and absorber elements by an atomic layer deposition process.

17. A method comprising:

applying converter elements and reflector elements and/or absorber elements to a surface of a carrier on separate areas of the carrier;

applying the converter elements and the reflector elements and/or the absorber elements to an electromagnetic radiation emitting device by applying the carrier to the electromagnetic radiation emitting device such that the surface of the carrier with the applied converter elements and the reflector elements and/or the absorber elements faces the electromagnetic radiation emitting device; and after applying the carrier to the electromagnetic radiation emitting device, forming a converter layer and a reflector layer and/or an absorber layer on the electromagnetic radiation emitting device by depositing a plurality of thin layers on the converter elements and the reflector elements and/or the absorber elements using an atomic layer deposition process.

18. An electromagnetic radiation emitting device comprising:

a semiconductor chip configured to emit electromagnetic radiation;

at least one converter layer located on the semiconductor chip, wherein the at least one converter layer has a plurality of thin layers in which converter elements are embedded, and wherein each of the plurality of thin layers has a thickness of at most 100 nm; and a reflector layer and/or an absorber layer seamlessly arranged next to the converter layer, and wherein the reflector layer and/or the absorber layer comprise the plurality of thin layers in which the converter elements are embedded.

* * * * *